(12) United States Patent
Park

(10) Patent No.: US 7,476,584 B2
(45) Date of Patent: Jan. 13, 2009

(54) METHOD OF FABRICATING A SEMICONDUCTOR DEVICE WITH A BIT LINE CONTACT PLUG

(75) Inventor: Je-Min Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 310 days.

(21) Appl. No.: 11/425,081

(22) Filed: Jun. 19, 2006

(65) Prior Publication Data

US 2006/0284229 A1 Dec. 21, 2006

(30) Foreign Application Priority Data

Jun. 20, 2005 (KR) .................. 10-2005-0053016

(51) Int. Cl.
*H01L 21/8238* (2006.01)
(52) U.S. Cl. .............. 438/233; 438/199; 257/E27.087; 257/774
(58) Field of Classification Search ................ 438/734, 438/735, 199, 706, 233; 257/E27.087
See application file for complete search history.

(56) References Cited

U.S. PATENT DOCUMENTS

| 7,329,575 | B2 * | 2/2008 | Shinkawata | 438/253 |
| 7,329,918 | B2 * | 2/2008 | Cho et al. | 257/303 |
| 2003/0213992 | A1 * | 11/2003 | Kubo | 257/326 |
| 2004/0012022 | A1 | 1/2004 | Wu | |
| 2004/0124457 | A1 * | 7/2004 | Kubo | 257/296 |
| 2004/0173836 | A1 * | 9/2004 | Oh et al. | 257/303 |
| 2004/0183111 | A1 * | 9/2004 | Shinkawata | 257/296 |
| 2005/0236655 | A1 * | 10/2005 | Takeuchi | 257/295 |
| 2007/0048917 | A1 * | 3/2007 | Yamamoto et al. | 438/197 |
| 2007/0128812 | A1 * | 6/2007 | Lee et al. | 438/291 |

FOREIGN PATENT DOCUMENTS

| JP | 10-004190 | 1/1998 |
| JP | 2003-007817 | 1/2003 |
| KR | 2005-0002075 | 1/2005 |

OTHER PUBLICATIONS

English language abstract of Korean Publication No. 2005-0002075.
English language abstract of Japanese Publication No. 10-004190.
English language abstract of Japanese Publication No. 2003-007817.

* cited by examiner

*Primary Examiner*—Jerome Jackson, Jr.
*Assistant Examiner*—Paul A Budd
(74) *Attorney, Agent, or Firm*—Marger Johnson & McCollom, P.C.

(57) ABSTRACT

In one embodiment, a semiconductor device includes a plurality of gate electrodes formed on a semiconductor substrate including a cell region, a core region, and a peripheral circuit region, along with source/drain regions. A first landing pad contacts the source/drain of the cell region. A second landing pad contacts the source/drain of an NMOS of the core region. A first, second, third, and fourth contact plug, each surrounded by spacers, respectively contact the first landing pad, the second landing pad, the source/drain of a PMOS of the core region, and the source/drain of the peripheral circuit region. Also, a fifth and sixth contact plug, respectively contact the source/drain of the NMOS of the peripheral circuit region and the gate conductive layer included in the gate electrode of the peripheral circuit region.

26 Claims, 10 Drawing Sheets

METHOD OF FABRICATING A SEMICONDUCTOR DEVICE WITH A BIT LINE CONTACT PLUG

CROSS-REFERENCE TO RELATED PATENT APPLICATION

This application claims the benefit of Korean Patent Application No. 10-2005-0053016, filed on Jun. 20, 2005, in the Korean Intellectual Property Office, the disclosure of which is incorporated herein by reference in its entirety.

BACKGROUND OF THE INVENTION

1. Field of the Invention

The present invention relates to a semiconductor device and a method of fabricating the same and, more particularly, to a semiconductor device with a contact plug (referred to as a bit line contact plug) for bit line connection and a method of fabricating the same.

2. Description of the Related Art

Because device patterns are minute, bit line contact plugs are separately formed in a cell region, a core region, and a peripheral circuit region when performing conventional $8F^2$ DRAM processing. This is because of the large differences in the etching targets. That is, only an oxide layer used as an interlayer insulating layer is etched to be a slight etching target when a contact hole for a bit line contact plug is formed in a cell region. On the other hand, when a contact hole for a bit line contact plug in core and peripheral circuit regions are formed, an etching process is performed further down to the level of a silicon nitride layer used as a gate hard mask and an active region of a semiconductor substrate. Because the contact holes in the cell region and the contact holes in the core and peripheral circuit regions must be separately formed, a plurality of photoresist patterns are required, which complicate the overall fabrication process and increase the manufacturing costs.

Therefore, a method of forming a contact hole is suggested, in which a condition with a high etching selectivity is developed to merge the forming of the contact hole that exposes a contact of the cell region and which further exposes the source/drain of an NMOS of the core and peripheral circuit regions. Then, a contact hole to expose a gate conductive layer on the core and peripheral circuit regions, and a contact hole to expose the source/drain of the PMOS of the core and peripheral circuit regions, are formed.

However, as DRAMs become more highly integrated, the structure is changed from $8F^2$ to $6F^2$. In the $6F^2$ structure, a core region layout less than a design rule is required. This in turn makes cell region processing become more difficult when forming a bit line contact plug because of the complicate requirements involved.

In particular, because the bit line contact plug in the cell region is closer to a storage node contact plug than in an $8F^2$ structure, a spacer must be formed to prevent a short from being formed between the storage node contact plug and the bit line contact plug. However, a contact plug connected to a gate conductive layer on the core and peripheral circuit regions usually has no spacer for decreasing contact resistance because the spacer reduces the contact area. Furthermore, the contact plug connected to the source/drain of the NMOS of the peripheral circuit region and the contact plug connected to the source/drain of the PMOS of the core region may be formed by a conventional method. However, the contact plug connected to the source/drain of the NMOS of the core region, and the contact plug connected to the source/drain of the PMOS are formed by a self-aligned contact (SAC) technique. Accordingly, the contact plug connected to the source/drain of the NMOS of the core and to the peripheral circuit regions is different from the contact plug connected to the source/drain of the PMOS.

In addition, ion implantation used to form a plug layer of high concentration is performed to reduce contact resistance by supplementing dopants lost after the contact hole etching. But because the plug layer is closer to a channel in the case of a contact hole formed by the SAC technique it has an effect on the channel (i.e., a plug effect). Due to this fact, ion implantation to the plug layer cannot be performed simultaneously with the formation of both the contact holes embodied by the SAC and a typically formed contact hole, thereby complicating the overall fabrication process.

Thus, when forming a bit line contact plug of a $6F^2$ DRAM under current practices, a bit line contact hole in a cell region is first formed. A contact hole that exposes a source/drain of an NMOS of a core region and a contact hole that exposes a source/drain of a PMOS are respectively formed by the SAC technique. Thereafter, a contact hole that exposes a source/drain of an NMOS of a peripheral circuit region, and a contact hole that exposes of source/drain of a PMOS are respectively formed by the SAC technique. Then, the ion implantation is performed to respective contact holes to form an $N^+$ type plug layer and a $P^+$ type plug layer. Therefore, in $6F^2$ DRAM, the separate kinds of the contact holes formed require forming a photoresist pattern 5~6 times, thereby complicating the overall fabrication process and increasing the manufacturing costs.

SUMMARY

The present invention provides a semiconductor device and a method of forming the semiconductor device, in which a manufacturing process is simplified by decreasing the number of photoresist patterns required during the formation of contact plugs in the semiconductor device.

According to an embodiment of the present invention, the semiconductor device may include a plurality of gate electrodes formed on a semiconductor substrate including a cell region, a core region, and a peripheral circuit region, along with a corresponding plurality of source/drain regions. A first landing pad contacts the source/drain of the cell region. A second landing pad contacts the source/drain of an NMOS of the core region. A first, second, third, and fourth contact plug, each surrounded by spacers, respectively contact the first landing pad, the second landing pad, the source/drain of a PMOS of the core region, and the source/drain of the peripheral circuit region. Also, a fifth and sixth contact plug respectively contact the source/drain of the NMOS of the peripheral circuit region and the gate conductive layer included in the gate electrode of the peripheral circuit region.

BRIEF DESCRIPTION OF THE DRAWINGS

The above and other features and advantages of the present invention will become more apparent by describing embodiments in detail with reference to the attached drawings in which.

DETAILED DESCRIPTION

Figure 1:
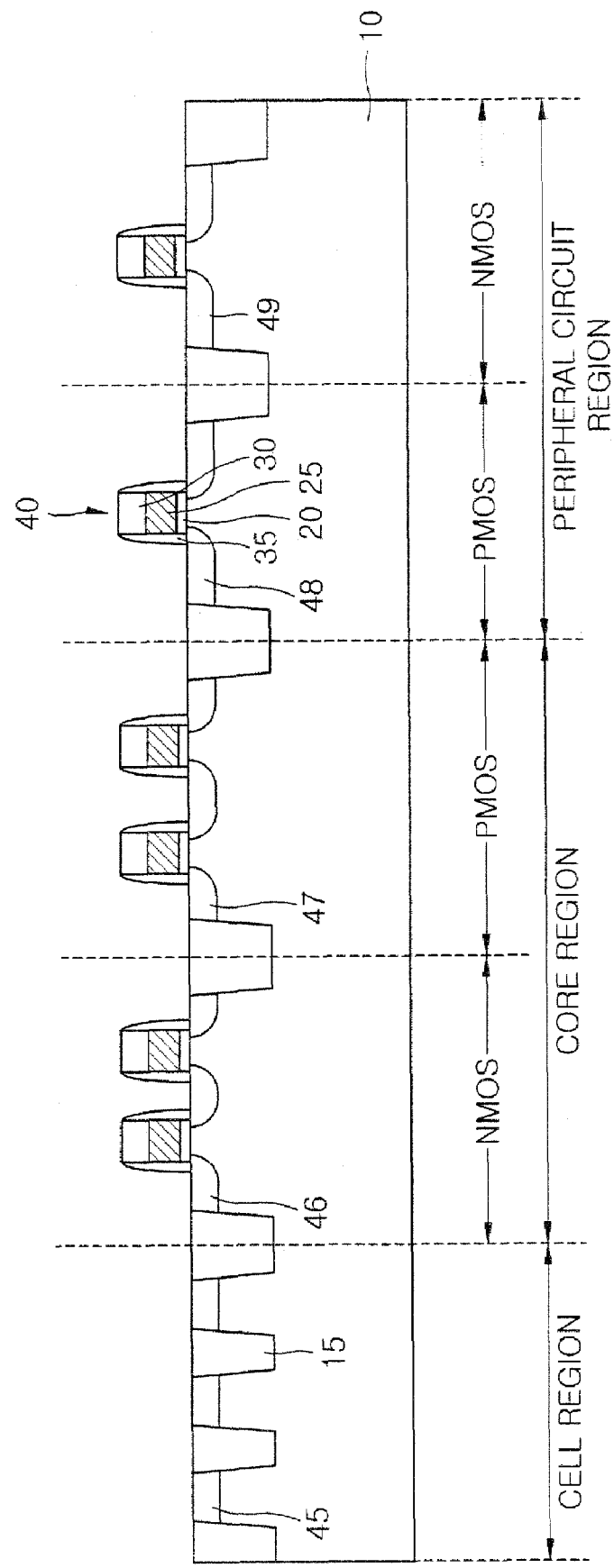
FIGS. 1 through 10 are cross-sectional views along a word line of a DRAM illustrating a method of fabricating a semiconductor device according to the present invention.

The present invention will be described more fully hereinafter with reference to the accompanying drawings in which embodiments of the invention are shown. This invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the forms of elements are exaggerated for clarity. To facilitate understanding, identical reference numerals have been used, where possible, to designate identical elements that are common to the figures.

FIGS. 1 through 10 are cross-sectional views along a word line of a DRAM illustrating a method of fabricating a semiconductor device according to an embodiment of the present invention.

First referring to FIG. 10, a structure of the semiconductor device will be described. The semiconductor device includes a semiconductor substrate 10 partitioned by a cell region, a core region, and a peripheral circuit region. A gate electrode 40 is formed on the semiconductor substrate 10, and sources/drains 45, 46, 47, 48, and 49 are formed in the semiconductor substrate 10. The gate electrode 40 includes a stack of a gate insulating layer 20, a gate conductive layer 25, and a gate hard mask 30, with gate spacers 35 formed on both sidewalls of the stack.

A first landing pad 55 contacts the source/drain 45 of the cell region, and a second landing pad 60 contacts the source/drain 46 of the NMOS of the core region. A first contact plug 90a, with an outer wall wholly encircled or surrounded by a spacer 85, contacts the first landing pad 55. A second contact plug 90b, with an outer wall wholly encircled or surrounded by a spacer 86, contacts the second landing pad 60. A third contact plug 90c, with an upper outer wall encircled or surrounded by a spacer 87, contacts the source/drain 47 of the PMOS of the core region. A fourth contact plug 90d, with an upper outer wall encircled by a spacer 88, contacts the source/drain 48 of the PMOS of the peripheral circuit region. A fifth contact plug 90e, preferably with no spacer, is disposed on the source/drain 49 of the NMOS of the peripheral circuit region. A sixth contact plug 90f, preferably with no spacer, contacts a gate conductive layer 25 of the peripheral circuit region.

The first landing pad 55, the second landing pad 60, and the third contact plug 90c are the self-aligned landing pad or the contact plug. A bit line 90g is integrally connected to the first through sixth contact plugs 90a, 90b, 90c, 90d, 90e, and 90f. A hard mask pattern 70a is further disposed between the bit line 90g and the second interlayer insulating layer 65. The hard mask pattern 70a may comprise silicon nitride. The first through sixth contact plugs 90a, 90b, 90c, 90d, 90e, and 90f may be conductive layers that include a barrier metal layer and a metal layer for the bit line.

The bottom of the spacer 87 within the third contact plug 90c and the bottom of the spacer 88 within the fourth contact plug 90d may be disposed from about 500 Å to about 4000 Å above a surface of the semiconductor substrate 10. The spacers 85, 86, 87, and 88 may be composed of silicon nitride or polysilicon nitride. The third contact plug 90c and the fourth contact plug 90d have widths enlarged, i.e., gradually increased, from the lower surfaces of the respective spacers 87 and 88. An enlarged portion of the third contact plug 90c is in contact with the gate spacer 35 of the PMOS of the core region.

Furthermore, N+ ion implantation layers IIP1_L, i.e., N+ plug layers, are formed on the bottoms of the first contact plug 90a and the second contact plug 90b, and P+ ion implantation layers IIP2_L, i.e., P+ plug layers, are formed on the bottoms of the third contact plug 90c and the fourth contact plug 90d.

Also, N+ ion implantation layers IIP3_L, i.e., N+ plug layers, are formed on the bottoms of the fifth contact plug 90e and the sixth contact plug 90f.

Such a semiconductor device can secure maximum contact area because the first and second landing pads 55 and 60, and the third contact plug 90c, are self-aligned. Moreover, the fifth contact plug 90e contacting the source/drain 49 of the NMOS of the peripheral circuit region, and the sixth contact plug 90f, contacting the gate conductive layer 25, have no spacer to allow for securing maximum contact area. Since the first through fourth contact plugs 90a, 90b, 90c, and 90d have spacers 85, 86, 87, and 88, respectively, an electrical short from an adjacent contact pattern (e.g., a storage node contact plug adjacent to the first contact plug 90a in the cell region) can be prevented. By merging the first contact plug 90a and the second contact plug 90b, merging the third contact plug 90c and the fourth contact plug 90d, and merging the fifth contact plug 90e and the sixth contact plug 90f, the number of the photoresist patterning process steps is decreased, which simplifies the overall fabrication process and reduce manufacturing costs.

A method of fabricating the semiconductor device according to an embodiment of the present invention will now be described.

Referring to FIG. 1, a device isolating layer 15 such as a shallow trench isolation (STI) layer is formed in a semiconductor substrate 10 to define (partition) a semiconductor device into a cell region, a core region, and a peripheral circuit region, while simultaneously defining an active region. Next, an ion implantation is performed to form a well structure, which is not illustrated in the drawing. The stacked structure of a gate insulating layer 20, a gate conductive layer 25, and a gate hard mask 30 is formed on the semiconductor substrate 10, and gate spacers 35 are formed on both sidewalls of the stacked structure, thereby forming a gate electrode 40. Then, ion implantation is performed into the semiconductor substrate 10 between the gate electrodes 40 to form sources/drains 45, 46, 47, 48, and 49.

The gate electrodes 40 of the cell region are spaced apart from one another by a constant interval in the cross-sectional view cut in the bit line direction, but are not shown in the presently illustrated word line direction. The gate insulating layer 20 is mainly composed from an oxide group, and the gate conductive layer 25 is composed of a single material such as polysilicon, tungsten, tungsten silicide, and tungsten nitride, or a composite of these materials. The gate hard mask 30 prevents the gate conductive layer 25 from being attacked during a subsequent process such as in forming a contact hole, and prevents an electrical short between the gate conductive layer 25 and a subsequently formed contact plug. Thus, the gate hard mask 30 may be composed of silicon oxide nitride or silicon nitride. The gate spacer 35 is formed by thinly depositing an insulating layer such as a polysilicon layer or a silicon nitride layer along a profile formed with the stacked structure of the gate insulating layer 20, the gate conductive layer 25, and the gate hard mask 30, and performing anisotropic blanket etching. The gate spacer 35 prevents a sidewall attack to the gate electrode 40 during subsequent processes, such as in the forming of the contact hole.

In this case, the sources/drains 45, 46, 47, 48, and 49 may have a Lightly Doped Drain (LDD) structure. In other words, after forming the stacked structure of the gate insulating layer 20, the gate conductive layer 25, and the gate hard mask 30, the stacked structure is used as a mask to perform a first impurity ion implantation for forming the LDD structure. Then, the gate spacers 35 are formed on both sidewalls of the stacked structure, and a second impurity ion implantation is performed to form the LDD structure, thereby completing the sources/drains 45, 46, 47, 48 and 49.

Figure 2:
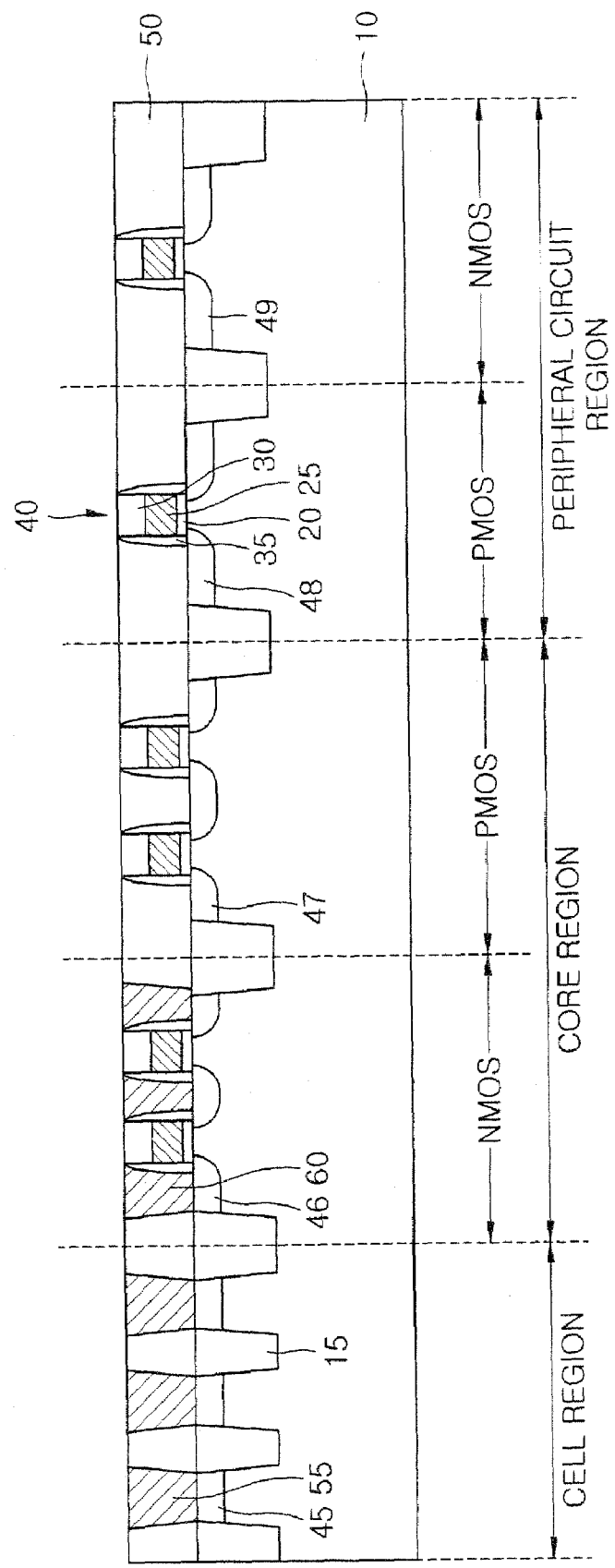

Referring to FIG. 2, a first interlayer insulating layer 50 is formed and fills a space between adjacent gate electrodes 40. If necessary, an upper surface of the first interlayer insulating layer 50 is planarized. The first interlayer insulating layer 50 may be composed of a material from the silicon oxide group, such as Boron Phosphorus Silicate Glass (BPSG), Boron Silicate Glass (BSG), Phosphorus Silicate Glass (PSG), Plasma Enhanced-TetraEthylOrthoSilicate, or High Density Plasma. The planarization may be performed by reflow or Chemical Mechanical Polishing (CMP).

After forming the first interlayer insulating layer 50, the contact hole that exposes the source/drain 45 of the cell region, and the contact hole that exposes the source/drain 46 of the NMOS of the core region are self-aligned. The contact holes are then fully filled with a conductive layer. In this case, a doped polysilicon layer is used as the conductive layer, however a material such as tungsten, Ti, and TiN may also be used. Subsequently, the conductive layer is planarized so as to expose an upper surface of the gate hard mask 30. By doing so, the first landing pad 55, contacting the source/drain 45 of the cell region, and the second land pad 60, contacting the source/drain 46 of the NMOS of the core region, are formed within the respective contact holes. The first landing pad 55 partially (in the middle portion) connects with the bit line by means of the contact plug in a subsequent process, and the other portion (in the periphery) is connected to the storage node contact plug.

Figure 3:
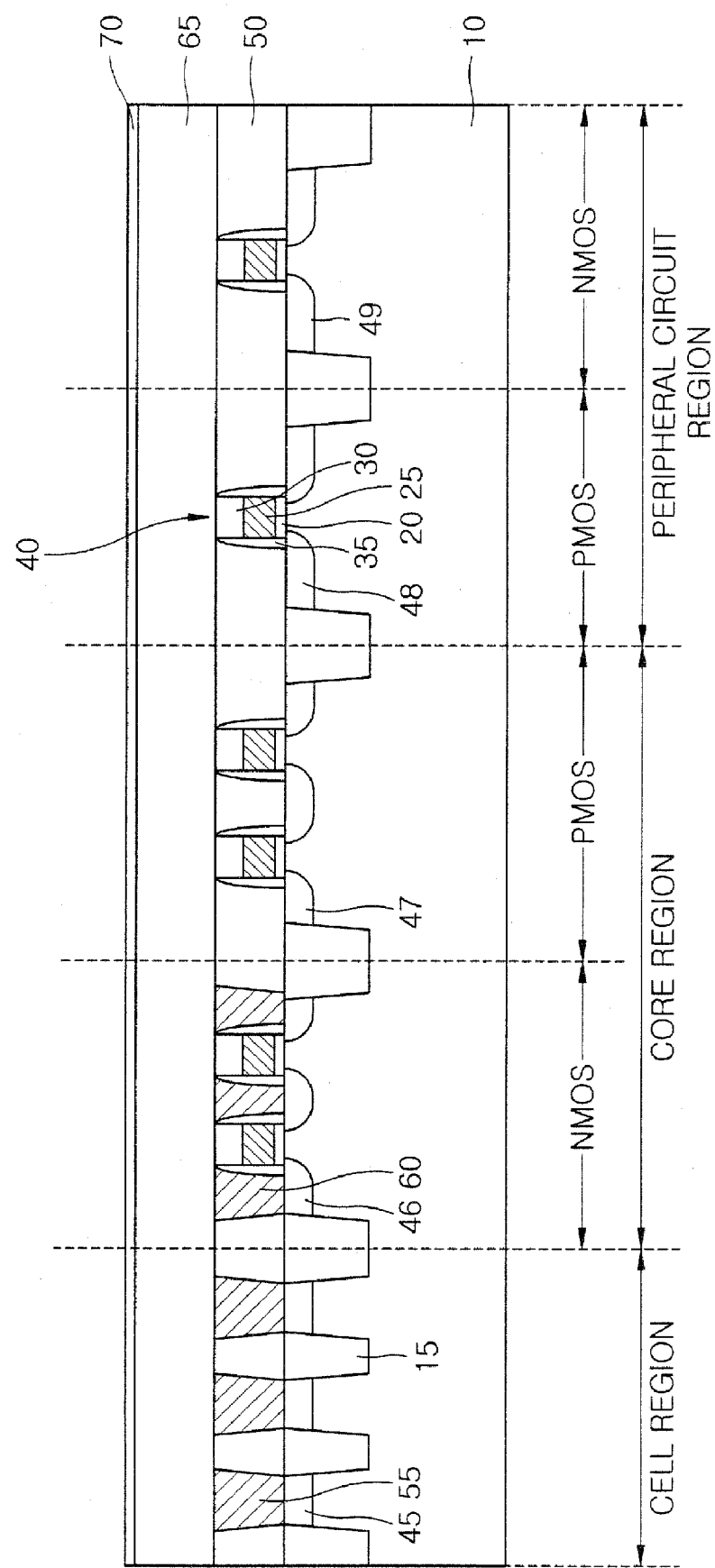

Referring to FIG. 3, a second interlayer insulating layer 65 and a hard mask layer 70 are formed on the first interlayer insulating layer 50, the gate electrode 40, the first landing pad 55, and the second landing pad 60. Similar to the first interlayer insulating layer 50, the second interlayer insulating layer 65 may be composed of an oxide such as BPSG, BSG, PSG, PE-TEOS, or HDP. If necessary, the second interlayer insulating layer 65 may also be planarized. The hard mask layer 70 is composed of silicon nitride and has a thickness between about 50 Å and about 500 Å. In addition, a material layer having sufficient etch selectivity to the silicon oxide layer constituting the second interlayer insulating layer 65 may be used.

Figure 4:
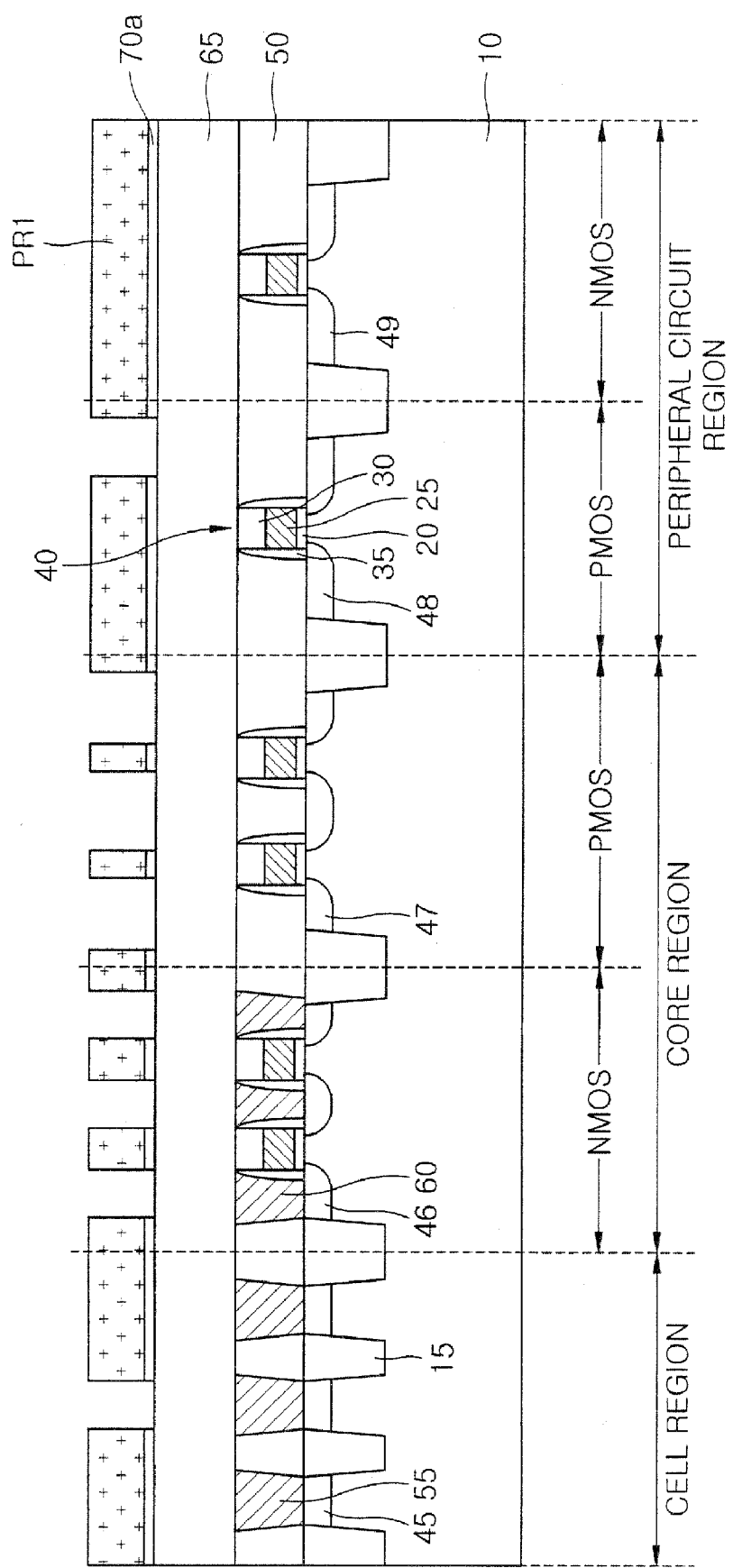

Referring to FIG. 4, a first photoresist pattern PR1 is formed on the hard mask layer 70. When forming the first photoresist pattern PR1, an exposure facility using a KrF wavelength as a light source may be employed. Using the first photoresist pattern PR1 as an etch mask, the hard mask layer 70 is etched to form a hard mask pattern 70a.

Figure 5:
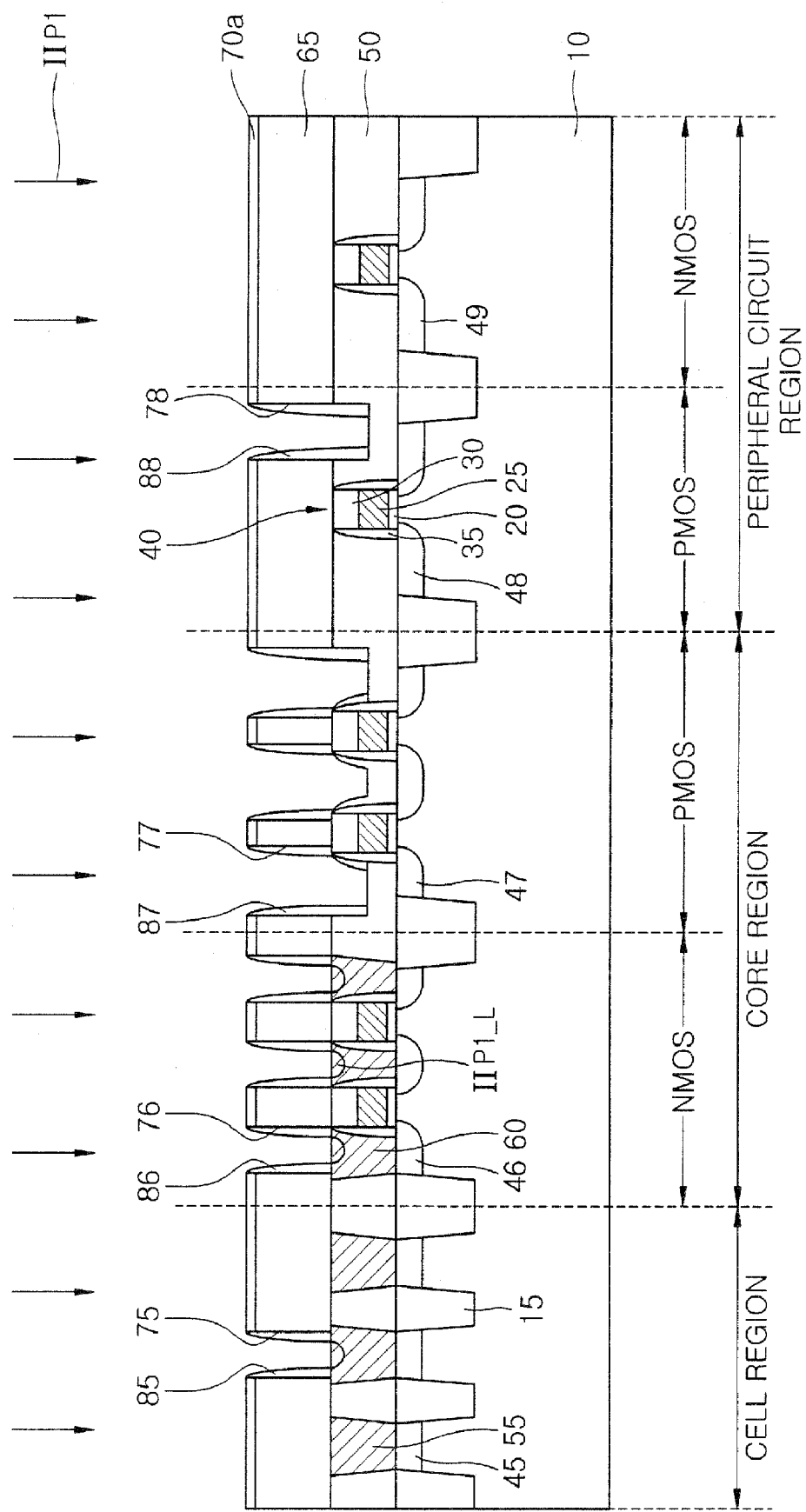

Referring to FIG. 5, after removing the first photoresist pattern PR1, the hard mask pattern 70a is used as an etch mask to etch the second interlayer insulating layer 65, thereby forming a first contact hole 75 and a second contact hole 76. Simultaneously, the second interlayer insulating layer 65 and the first interlayer insulating layer 50 are etched to form a first trench 77 and a second trench 78. The first trench 77 is self-aligned.

In this case, the first contact hole 75 exposes an upper surface of the first landing pad 55, and the second contact hole 76 exposes an upper surface of the second landing pad 60. Also, because the first trench 77 is formed by etching the second interlayer insulating layer 65 and a prescribed depth of the first interlayer insulating layer 50 disposed on the source/drain 47 of the PMOS of the core region, the bottom of the first trench 77 is placed on the middle of the first interlayer insulating layer 50. The second trench 78 is formed by etching the second interlayer insulating layer 65 and a prescribed depth of the first interlayer insulating layer 50 on the upper portion of the source/drain 48 of the PMOS of the peripheral circuit region, so that the bottom of the second trench 78 is placed on the middle of the first interlayer insulating layer 50.

The first contact hole 75, the second contact hole 76, the first trench 77, and the second trench 78 may be formed by etching the second interlayer insulating layer 65 to expose upper surfaces of the first landing pad 55 and the second landing pad 60, and then performing over-etching to further etch the first interlayer insulating layer 50. By adjusting the over-etching time, the bottoms of the first trench 77 and the second trench 78 may be formed to a depth of about 500 Å to about 4000 Å from the surface of the semiconductor substrate 10.

Subsequently, the spacers 85, 86, 87, and 88 are formed along the inner walls of the first contact hole 75, the second contact hole 76, the first trench 77, and the second trench 78. The spacers 85, 86, 87, and 88 are formed by thinly covering an insulating layer, such as a polysilicon nitride layer or a silicon nitride layer, along the first contact hole 75, the second contact hole 76, the first trench 77, and the second trench 78 to a thickness from about 50 to about 500 Å, and then performing blanket etching. By forming the first trench 77 to expose the gate spacer 35 of the PMOS of the core region, the spacer 87 formed along the inner wall of the first trench 77 is also formed on the gate spacer 35 of the PMOS of the core region.

Using the hard mask pattern 70a and the spacers 85, 86, 87, and 88 as ion implantation masks, $N^+$ ion implantation IIP1 is performed. By doing so, the $N^+$ ion implantation layers IIP1_L, i.e., $N^+$ type plug layers, are formed on the bottoms of the first contact hole 75 and the second contact hole 76 to compensate for dopant loss (i.e. out diffusion of dopants into the ambient) during the etching of the first contact hole 75 and the second contact hole 76, thereby improving contact resistance.

Figure 6:
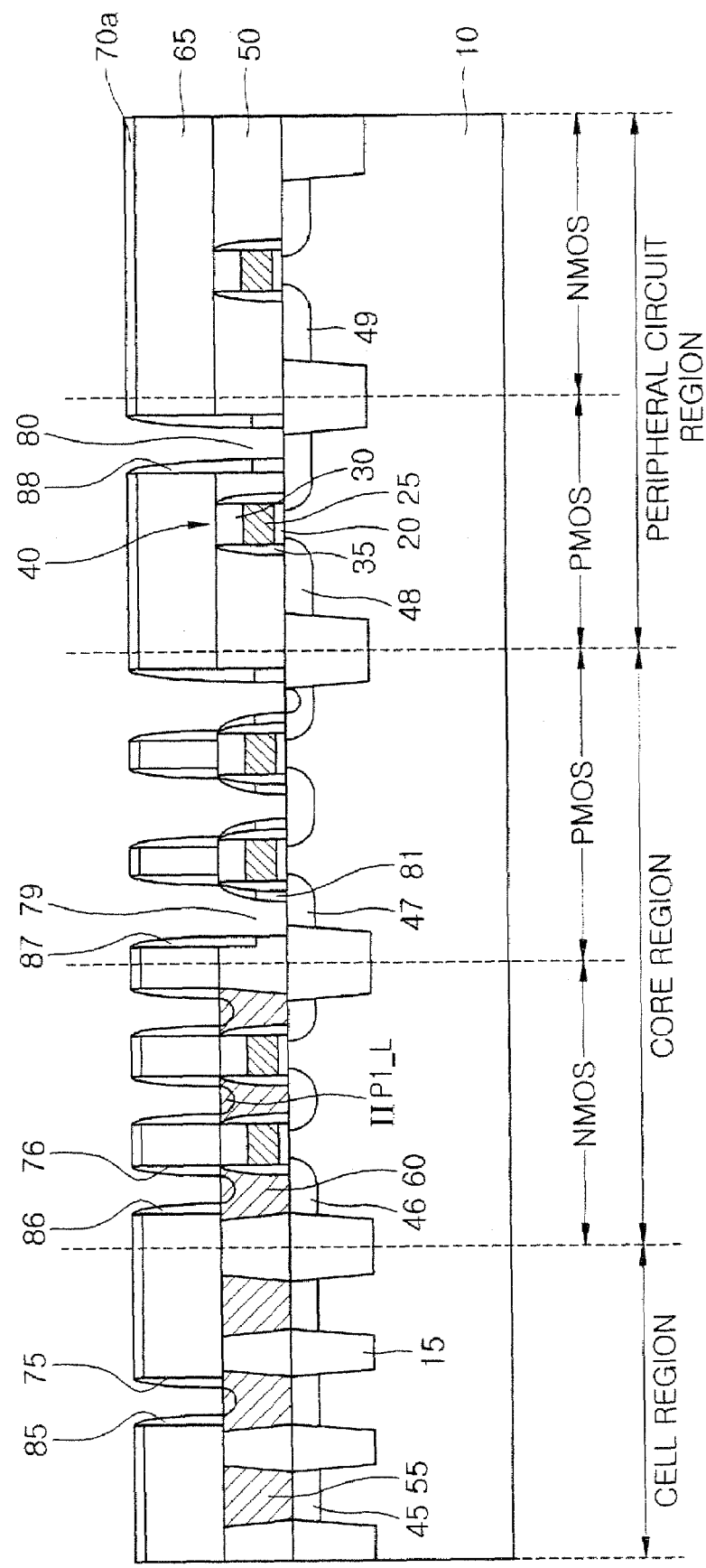

Referring to FIG. 6, using the hard mask pattern 70a and the spacers 85, 86, 87, and 88 as etch masks, the first interlayer insulating layer 50 is further etched to deepen the first trench 77 until reaching the semiconductor substrate 10, thereby forming a third contact hole 79 that exposes the source/drain 47 of the PMOS of the core region. Because the first trench 77 is self-aligned, the third contact hole 79 is also self-aligned. By doing so, an oxide layer spacer 81 consisting of the first interlayer insulating layer is formed on the lower inner surface of the third contact hole 79 by the spacer 87 disposed on the gate spacer 35 of the PMOS of the core region. Similarly, using the hard mask pattern 70a and the spacers 85, 86, 87, and 88 as etch masks, the first interlayer insulating layer 50 is further etched to deepen the second trench 78 until reaching the semiconductor substrate 10, thereby forming a fourth contact hole 80 that exposes the source/drain 48 of the PMOS of the peripheral circuit region.

Figure 7:
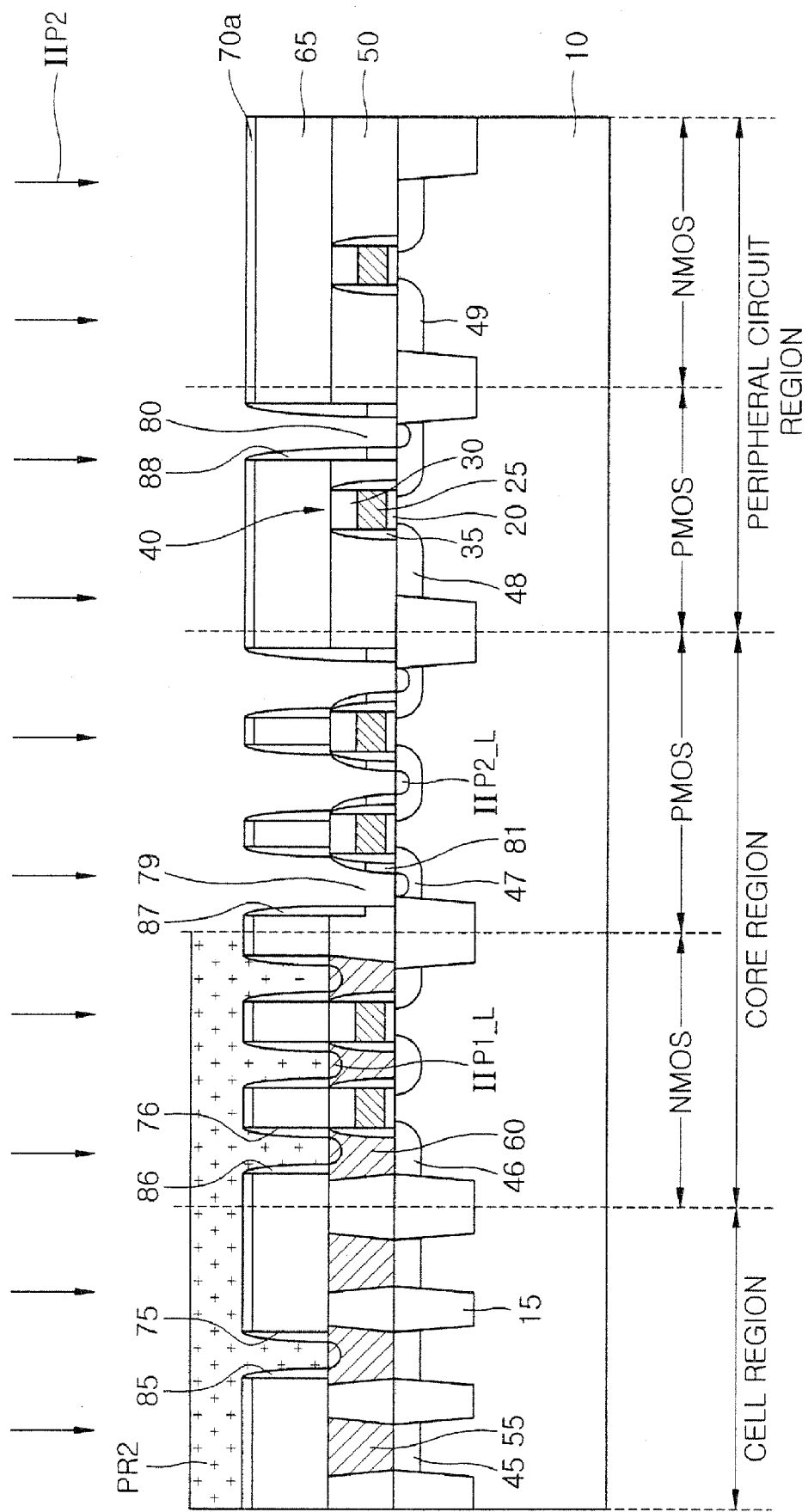

Referring to FIG. 7, a second photoresist pattern PR2 that exposes the third contact hole 79 and the fourth contact hole 80 is formed on the resultant structure of FIG. 6. The second photoresist pattern PR2 may be formed by means of an exposure facility using an i-line wavelength as a light source. Thereafter, P+ ion implantation IIP2 is performed using the second photoresist pattern PR2 as an ion implantation mask. Then, P+ ion implantation layers II2_L, e.g., P+ plug layers, are formed on the bottoms of the third contact hole 79 and the fourth contact hole 80. In this case, a prescribed interval is secured between the P+ ion implantation layer IIP2_L and a channel of the PMOS of the core region by the oxide layer spacer 81. Therefore, a plug effect can be prevented.

Figure 8:
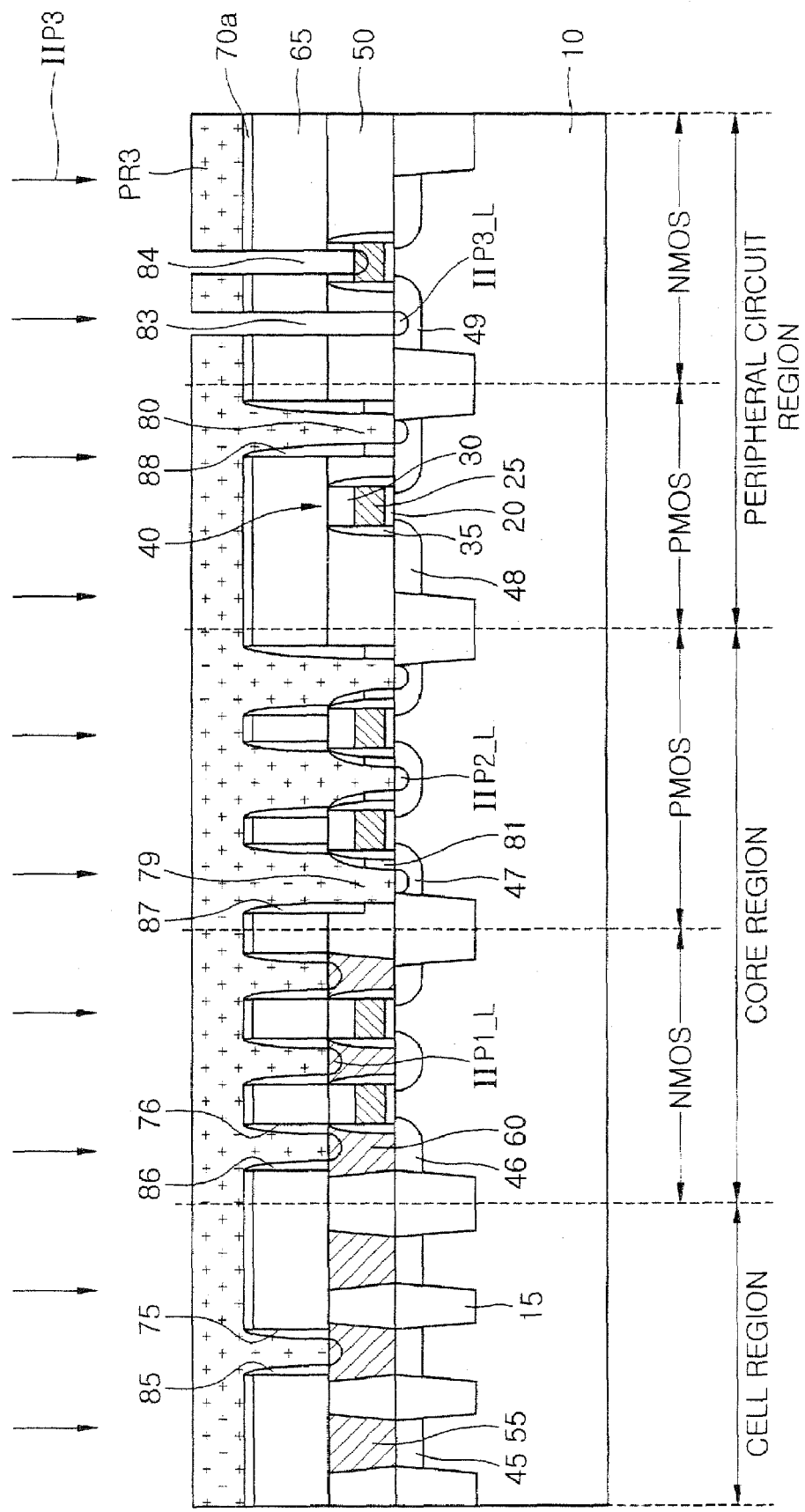

Referring to FIG. 8, after removing the second photoresist pattern PR2, a third photoresist pattern PR3 is formed on the hard mask pattern 70a to expose the source/drain 49 of the NMOS of the peripheral circuit region and exposing the gate conductive layer 25 of the peripheral circuit region. The third photoresist pattern PR3 may be formed by means of an exposure facility using a KrF wavelength as a light source, Then, using the third photoresist pattern PR3 as an etch mask, the first interlayer insulating layer 30 and the second interlayer insulating layer 65 are etched to form a fifth contact hole 83 and a sixth contact hole 84. Subsequently, the third photoresist pattern PR3 is used as an ion implantation mask, and $N^+$ ion implantation IIP3 is performed to form N+ ion implantation layers IIP3_L, i.e., N+ type plug layers, on the bottoms of the fifth contact hole 83 and the sixth contact hole 84.

Figure 9:
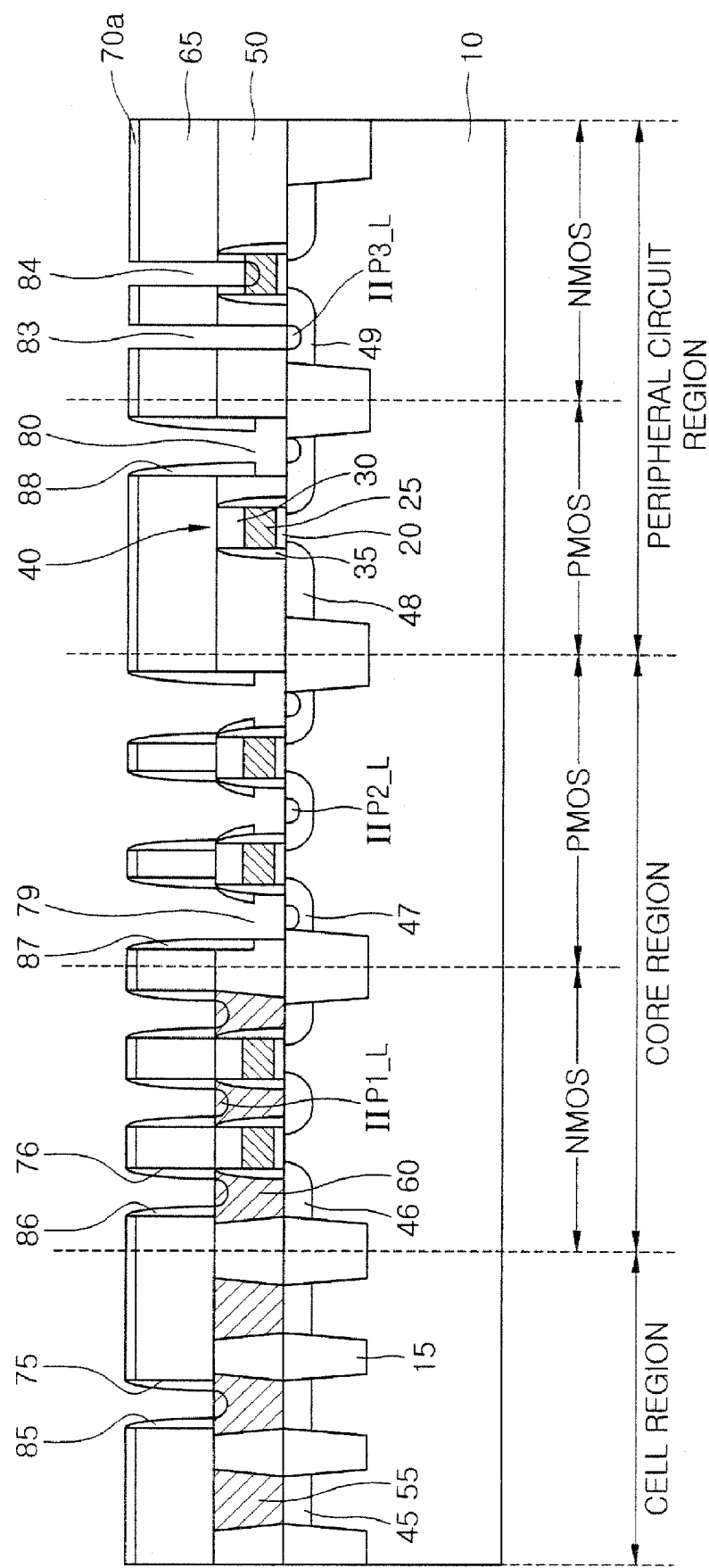

Referring to FIG. 9, the third photoresist pattern PR3 is removed, and wet cleaning is performed to enlarge the lower portions of the third contact hole 79 and the fourth contact hole 80. Particularly, the third contact hole 79 is enlarged until the gate spacer 35 of the PMOS of the core region is exposed. That is, the oxide layer spacer 81 composed of the first interlayer insulating layer formed on the lower inner wall of the third contact hole 79 is removed, thereby securing the maximum contact area.

Figure 10:
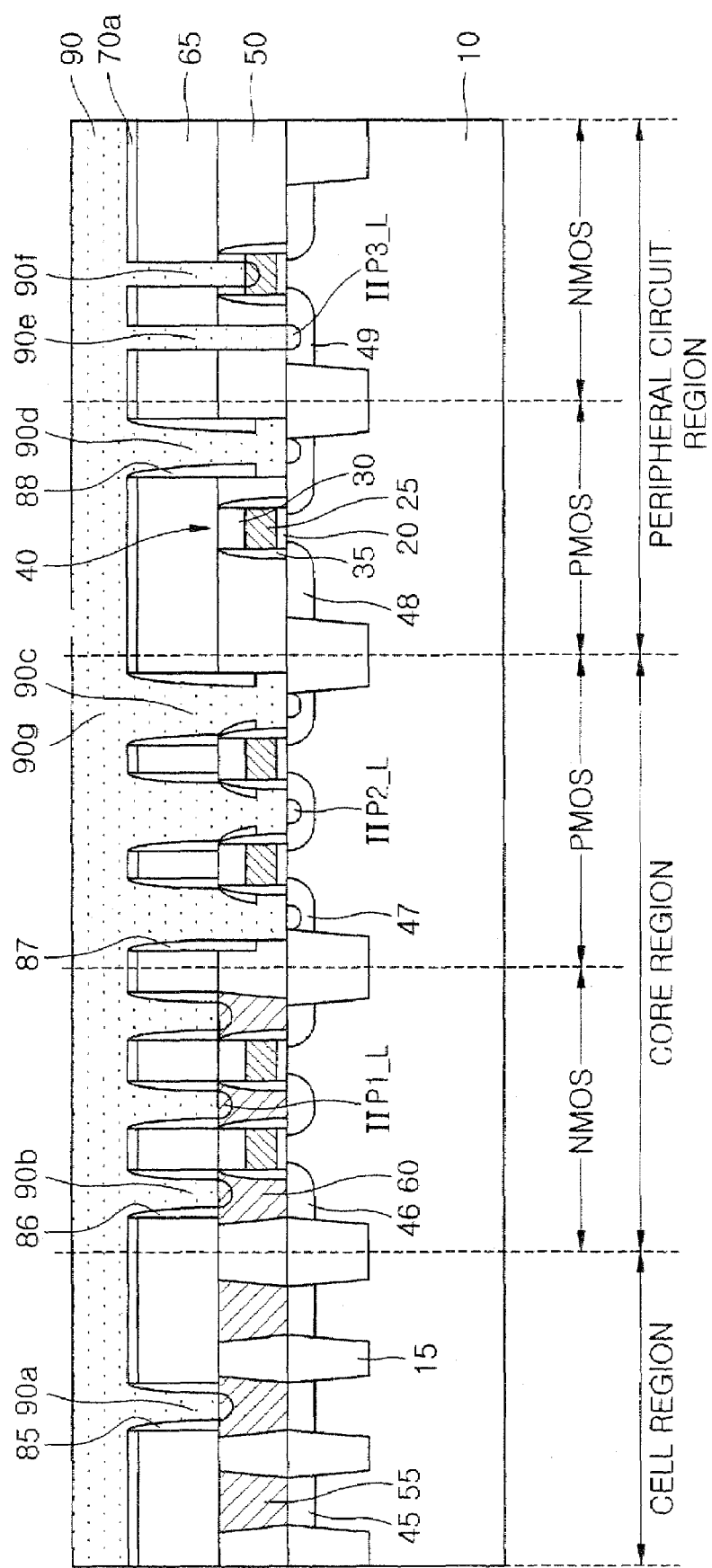

Referring to FIG. 10, a conductive layer 90 is deposited to fill the first through sixth contact holes 75, 76, 79, 80, 83, and 84. The conductive layer 90 may include a barrier metal layer and a metal layer for the bit line. The barrier metal layer may be composed of titanium, titanium nitride, etc. Also, the metal layer for the bit line may be tungsten, etc.

Thereafter, the conductive layer 90 is patterned to form the first through sixth contact plugs 90a, 90b, 90c, 90d, 90e, and 90f respectively filling the first through sixth contact holes 75, 76, 79, 80, 83, and 84. Additionally the bit line 90g is integrally connected to the first through sixth contact plugs 90a, 90b, 90c, 90d, 90e, and 90f. The bit line 90g is formed by etching the conductive layer 90 until the hard mask pattern 70a is exposed, or etching the conductive layer 90 and the hard mask pattern 70a until the second interlayer insulating layer 65 is exposed.

According to the method of fabricating the semiconductor device of the present invention, because of merging the first contact plug 90a and the second contact plug 90b, merging the third contact plug 90c and the fourth contact plug 90d, and merging the fifth contact plug 90e and the sixth contact plug 90f, the number of photoresist patterns formed is decreased, thereby simplifying the process and reducing the manufacturing costs. In addition, the oxide layer spacer is automatically formed when forming the third contact hole 79 that exposes the source/drain 47 of the PMOS of the core region, thereby preventing a plug effect. Also, the oxide layer spacer 81 is removed by wet cleaning in the subsequent process to secure the maximum contact area.

The semiconductor device according to the present invention has a structure where a contact plug in contact with a source/drain of an NMOS of the peripheral circuit region and a contact plug in contact with a gate conductive layer have no spacer in order to secure a maximum contact area. The other contact plugs have spacers, so that an electrical short from an adjacent conductive pattern can be prevented.

While the present invention has been particularly shown and described with reference to embodiments thereof, it will be understood by those of ordinary skill in the art that various changes in form and details may be made therein without departing from the spirit and scope of the present invention as defined by the following claims.

What is claimed is:

1. A method of fabricating a semiconductor device comprising:

forming a plurality of gate electrodes on a semiconductor substrate partitioned into a cell region, a core region, and a peripheral circuit region, wherein forming a gate electrode includes forming a gate spacer along both sidewalls of a stack of a gate insulating layer, a gate conductive layer, and a gate hard mask;

forming a source/drain within the semiconductor substrate;

forming a first interlayer insulating layer to fill a space between the gate electrodes;

forming a first landing pad contacting the source/drain of the cell region within the first interlayer insulating layer, and a second landing pad contacting the source/drain of an NMOS transistor of the core region;

forming a second interlayer insulating layer and a hard mask pattern on the first interlayer insulating layer, the gate electrode, the first landing pad and the second landing pad;

forming a first contact hole that exposes the first landing pad, and a second contact hole that exposes the second landing pad by etching the second interlayer insulating layer using the hard mask pattern as an etch mask, forming a first trench by etching the second interlayer insulating layer and a portion of the first interlayer insulating layer on the upper surface of the source/drain of a PMOS transistor of the core region, and forming a second trench by etching the second interlayer insulating layer and a portion of the first interlayer insulating layer on the upper portion of the source/drain of a PMOS transistor of the peripheral circuit region;

forming spacers respectively along inner walls of the first contact hole, the second contact hole, the first trench, and the second trench;

further etching the first interlayer insulating layer using the hard mask pattern and the spacer as etch masks, and deepening the first trench until reaching the semiconductor substrate to form a third contact hole that exposes the source/drain of the PMOS transistor of the core region, and deepening the second trench until reaching the semiconductor substrate to form a fourth contact hole that exposes the source/drain of the PMOS transistor of the peripheral circuit region; and etching the second interlayer insulating layer and the first interlayer insulating layer to form a fifth contact hole that exposes the source/drain of an NMOS transistor of the peripheral circuit and to form a sixth contact hole that exposes the gate conductive layer of the peripheral circuit region.

2. The method of claim 1, wherein the first landing pad and the second landing pad are formed by self-alignment.

3. The method of claim 1, wherein the third contact hole is formed by self-alignment.

4. The method of claim 1, wherein the forming the hard mask pattern comprises:

forming a hard mask layer on the second interlayer insulating layer;

forming a first photoresist pattern on the hard mask layer;

etching the hard mask layer using the first photoresist pattern as an etch mask; and removing the first photoresist pattern.

5. The method of claim 4, wherein an exposure facility using a light source with a KrF wavelength is employed when forming the first photoresist pattern.

6. The method of claim 4, further comprising $N^+$ ion implantation to the bottoms of the first contact hole and the second contact hole using the hard mask pattern and the spacer as ion implantation masks.

7. The method of claim 1, further comprising $N^+$ ion implantation to the bottoms of the first contact hole and the second contact hole.

8. The method of claim 1, wherein the bottoms of the first trench and the second trench are placed from about 500 Å to about 4000 Å from the surface of the semiconductor substrate.

9. The method of claim 1, further comprising $P^+$ ion implantation to the bottoms of the third contact hole and the fourth contact hole.

10. The method of claim 9, wherein the P+ ion implantation comprises:
   forming a second photoresist pattern on the resultant structure to expose the third contact hole and the fourth contact hole;
   performing $P^+$ ion implantation using the second photoresist pattern as an ion implantation mask; and
   removing the second photoresist pattern.

11. The method of claim 10, wherein an exposure facility using a light source with an i-line wavelength is employed when forming the second photoresist pattern.

12. The method of claim 1, wherein the forming of the fifth contact hole and the sixth contact hole comprises:
   forming a third photoresist pattern on the hard mask pattern to expose the source/drain of the NMOS transistor of the peripheral circuit region and expose the gate conductive layer of the peripheral circuit region; and
   etching the first interlayer insulating layer and the second interlayer insulating layer using the third photoresist pattern as an etch mask.

13. The method of claim 12, wherein an exposure facility using a light source with a KrF wavelength is employed when forming the third photoresist pattern.

14. The method of claim 12, further comprising $N^+$ ion implantation to the bottoms of the fifth contact hole and the sixth contact hole using the third photoresist pattern as an ion implantation mask.

15. The method of claim 14, further comprising removing the third photoresist pattern after the $N^+$ ion implantation.

16. The method of claim 15, further comprising enlarging lower portions of the third contact hole and the fourth contact hole after removing the third photoresist pattern.

17. The method of claim 16, wherein enlarging the lower portions of the third contact hole and the fourth contact hole comprises wet cleaning.

18. The method of claim 17, comprising enlarging the lower portion of the third contact hole until the gate spacer of the PMOS transistor of the core region is exposed.

19. The method of claim 1, further comprising performing $N^+$ ion implantation to the bottoms of the fifth contact hole and the sixth contact hole.

20. The method of claim 1, further comprising enlarging lower portions of the third contact hole and the fourth contact hole after forming the sixth contact hole.

21. The method of claim 1, further comprising:
   depositing a conductive layer to fill the first through sixth contact holes;
   patterning the conductive layer to form first through sixth contact plugs; and
   forming a bit line integrally connected to the contact plugs.

22. The method of claim 21, wherein the forming of the bit line comprises etching the conductive layer until the hard mask pattern is exposed.

23. The method of claim 21, wherein the forming of the bit line comprises etching the conductive layer and the hard mask pattern until the second interlayer insulating layer is exposed.

24. The method of claim 21, wherein the conductive layer comprises a barrier metal layer and a metal layer for the bit line.

25. The method of claim 1, wherein the first contact hole, the second contact hole, the first trench, and the second trench are simultaneously formed.

26. The method of claim 25, wherein the first contact hole, the second contact hole, the first trench, and the second trench are simultaneously formed by etching the second interlayer insulating layer to expose the first landing pad and the second landing pad, and then over-etching the first interlayer insulating layer.

* * * * *